FREQUENCY MODULATION CIRCUIT

Filed Jan. 7, 1963

INVENTORS
Richard D. Carsello
David L. Gunn.
BY Mueller & Aichele
Attys.

United States Patent Office 3,275,938

Patented Sept. 27, 1966

3,275,938

FREQUENCY MODULATION CIRCUIT

Richard D. Carsello, Chicago, and David L. Gunn, Lombard, Ill., assignors to Motorola, Inc., Chicago, Ill., a corporation of Illinois Filed Jan. 7, 1963, Ser. No. 249,847
6 Claims. (Cl. 325—349)

Figure 1:
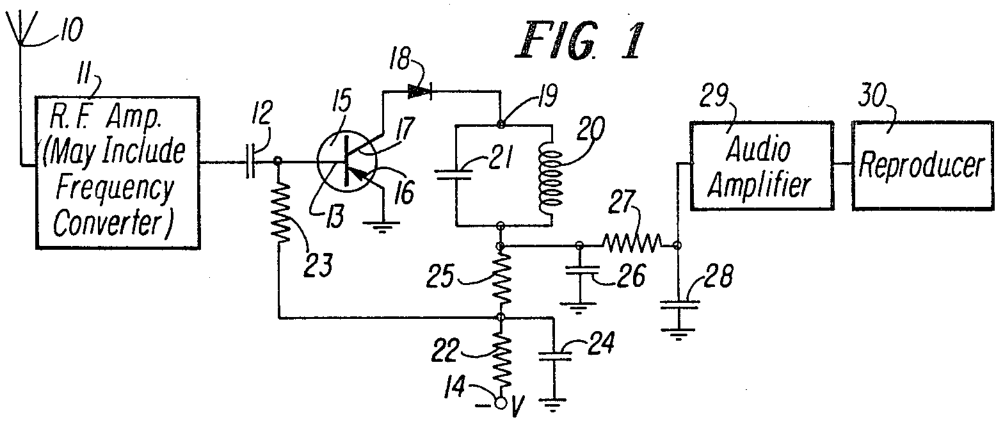

This invention relates to frequency modulation detector circuits, and more particularly to a simple transistor circuit which forms a limiter and detector for frequency modulation signals.

In the reception of frequency modulation signals, it is desirable to provide a circuit which responds to the variations in frequency, or modulation, of the received carrier wave, and which does not respond to variations which may occur in the amplitude of the received wave. Simple slope detector circuits have been used but these circuits respond to amplitude variations, and a separate limiter stage is required for removing amplitude variations before the wave is applied to the slope detector. Balanced detector circuits have been used which provide some immunity to amplitude variations in the applied wave, but these circuits have been relatively expensive requiring complex coils and a plurality of diodes to provide a balanced circuit. Further these circuits have the disadvantage that large drive signals are required so that additional amplification is necessary to provide a signal of the required input level.

It is therefore, an object of the present invention to provide an improved simple frequency modulation detector circuit.

A further object of the invention is to provide a frequency modulation detector circuit which is substantially non-responsive to amplitude variations in the applied wave.

Another object of the invention is to provide a frequency modulation detector circuit utilizing a single transistor, and which operates satisfactorily to detect low level frequency modulated waves.

A feature of this invention is the provision of a frequency modulation detector circuit including a transistor and a tuned circuit, with a diode coupling the same and selectively rendered conducting for periods which vary with the frequency of the applied wave, with current passed by the diode controlling the charge on a capacitor to develop the modulation signal. The tuned circuit is tuned above the frequency of the carrier wave to be detected and applies a voltage to the diode to cut off the same during a portion of each cycle to control the current pulses applied to the capacitor.

A further feature of the invention is the provision of a frequency modulation detector including a transistor having its collector electrode connected to a tuned circuit by a diode, which diode provides a high impedance for the transistor so that the transistor is saturated by small signals and does not respond to variations in amplitude of the applied wave. The diode also isolates the tuned circuit so that it is not loaded by the transistor.

Figure 2:
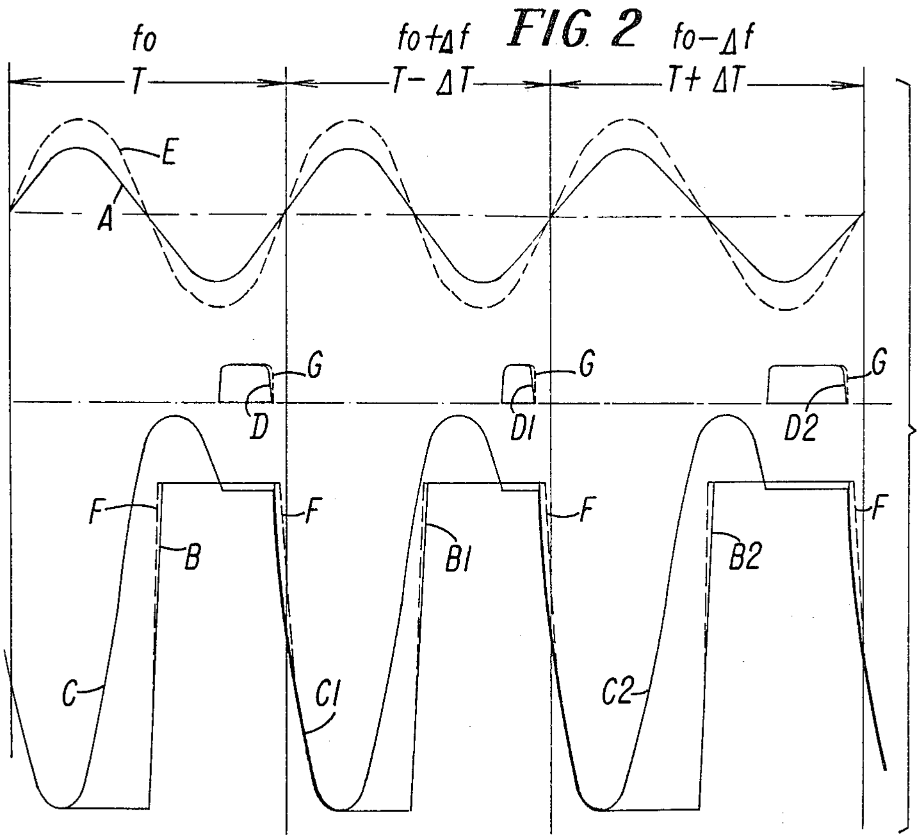

The invention is illustrated in the drawing wherein:

FIG. 1 is a circuit diagram illustrating the frequency modulation detector in an FM receiver; and FIG. 2 includes curves illustrating the operation of the frequency modulation detector of the invention.

In practicing the invention, a frequency modulation detector circuit is provided including a transistor coupled to a tuned circuit by a diode. The transistor may have a base electrode to which the modulated wave is applied, and an emitter electrode connected to ground. The collector electrode of the transistor is connected through the diode to the parallel resonant tuned circuit, which is tuned to a frequency higher than the frequency of the wave to be detected. At the start of transistor conduction, the diode is back-biased and provides a high impedance in the collector circuit so that the collector voltage rises immediately to the maximum value. The collector voltage is therefore substantially independent of the amplitude of the applied signal, and is essentially a square wave which occurs during substantially one half of each cycle of the applied wave. The tuned circuit applies a wave to the other electrode of the diode, and reverse biases the diode to hold the same non-conducting until the voltage of the resonant circuit drops below the voltage at the collector electrode. The tuned circuit is constructed so that the swing of the voltage thereacross is greater than the voltage swing at the collector. When the voltage of the tuned circuit drops below the voltage of the collector electrode, the collector voltage forward biases the diode so that it conducts to provide current flow which charges a capacitor. The duration of conduction during each cycle of the applied wave depends upon the frequency of the input signal, and as the frequency increases the period of conduction decreases. The pulses of various durations are integrated to produce an output or audio voltage depending upon the frequency modulation of the applied wave. Since the transistor saturates on small signals, changes in the amplitude of the applied wave have substantially no effect on the duration of the current pulses, and therefore do not appear in the reproduced audio signal.

Considering now the circuit as illustrated in the drawing, FIG. 1 shows a frequency modulation receiver including an antenna 10 connected to a radio frequency (RF) amplifier 11. The receiver may be of the tuned radio frequency type including one or more stages for amplifying the received signal. Alternatively, the receiver may be of the superheterodyne type wherein frequency converting and intermediate frequency (IF) amplifier stages are provided. The amplified RF or IF signal is applied through coupling capacitor 12 to the base electrode 13 of transistor 15. The emitter electrode 16 of transistor 15 is grounded. The collector electrode 17 is connected through diode 18 to terminal 19 of a parallel resonant circuit which includes inductor 20 and capacitor 21. Bias potential is applied through resistors 22 and 23 to the base electrode 13 of transistor 15 from a negative potential supply terminal 14, with capacitor 24 bypassing resistor 22 to provide decoupling. The negative potential is applied to the collector electrode 17 by resistors 22 and 25, coil 20 and diode 18. The output audio signal is developed across capacitor 26 and is filtered by the section including resistor 27 and capacitor 28. The audio output signal may be amplified in audio amplifier 29 and reproduced in reproducer 30, which may be a loudspeaker or other signal reproducing device.

As previously stated, the tuned circuit including coil 20 and capacitor 21 is tuned to a frequency above the maximum freqency of the carrier wave to be detected. It has been found that satisfactory operation is provided when this circuit is tuned to a frequency of the order of 8 percent greater than the center frequency of the wave being detected, but this value is not critical. For example, the incoming signal may be either RF or an IF signal having a center frequency of 100 kilocycles with a deviation of plus or minus 2½ kilocycles. In such case the tuned circuit would be tuned to a frequency of the order of 108 kilocycles. In any case, the tuned circuit should be tuned above the highest frequency of the modulated wave applied to the detector circuit.

The operation of the circuit of FIG. 1 will be apparent from a consideration of FIG. 2. Curve A illustrates the wave to be demodulated, the first cycle of which has a frequency $f_0$ and a period T. This wave is applied to the base electrode 13 of transistor 15 and causes the transistor to conduct when the wave is negative to produce a voltage at the collector electrode 17 of the transistor, as shown by curve B. The tuned circuit, because of resonance action, provides a voltage wave having an amplitude greater than the voltage at the collector electrode 17 of the transistor. This is illustrated by curve C. The amplitude of this voltage wave can be controlled by selecting the Q of the tuned circuit including coil 20 and capacitor 21. The diode 18 is poled so that the voltage of the tuned circuit reverse biases the diode and holds it cut off until the forward bias applied by the collector electrode exceeds this reverse bias. Accordingly, when the voltage at collector electrode 17 exceeds the voltage at terminal 19 of the tuned circuit, the diode will conduct. This will provide a pulse of current as is illustrated by pulses D. The pulse will continue until transistor 15 is cut off and the voltage at collector electrode 17 drops. At this time, the tuned circuit will be decoupled and the energy stored therein will produce oscillations at the natural frequency of oscillation of the tuned circuit. This is shown by the portion C1 of curve C.

The second cycle illustrated in FIG. 2 is for the case where the modulation causes the incoming frequency to be increased so that the frequency is $f_0+\Delta f$, and the period is $T-\Delta T$. As the frequency of applied signal will be closer to the frequency of the tuned circuit, the rise of the voltage pulse at the collector will take place closer to the rise in voltage of the tuned circuit. In such case the time duration of the pulse B1 will be reduced, since the period of the cycle is reduced. Therefore, the period of time during which the voltage at the collector electrode 17 exceeds the voltage across the tuned circuit will be reduced so that the current pulse D1 will have a smaller width, or duration, than the pulse D at the center frequency.

The third cycle in FIG. 2 illustrates an example wherein the frequency of the applied signal is reduced so that the frequency is $f_0-\Delta f$ and the period is $T+\Delta T$. In such case the frequency is farther from the frequency of the tuned circuit so that the rise of the pulse at the collector electrode 17, identified as B2, will be farther from the rise in the voltage across the tuned circuit (C2). Also the pulse B2 will have a greater duration than the pulse B provided at the center frequency, so that the time during which the voltage at collector electrode 17 is greater than the voltage across the resonant circuit will be increased to provide a longer current pulse D2.

It is therefore seen, that the duration of the current pulses produced by conduction of diode 18 will decrease from a normal or center value when the frequency increases, and will increase from the normal value when the frequency decreases. These pulses control the charge on capacitor 26 to reproduce the modulation on the applied wave. Capacitor 26 is normally charged to the voltage of terminal 14 through resistors 22 and 25. When diode 18 conducts, capacitor 26 will supply part of the current and will discharge. The time constant of capacitor 26 and resistor 25 is selected to integrate the current pulses to provide the modulation signal. The filter including resistor 27 and capacitor 28 further smoothes the demodulated or audio signal.

As previously stated, the detector circuit is substantially non-responsive to change in amplitude. This is illustrated by the dotted curves E, F and G in FIG. 2. The curve E illustrates an applied wave of higher amplitude than the applied wave A (solid line). Inasmuch as the collector voltage rises substantially to its maximum value when the transistor is rendered conducting, the period of conduction will be changed only slightly in response to the wave E of increased amplitude. This is shown by the dotted pulses F which are only very slightly larger than the pulses B. Actually the pulses are exaggerated in FIG. 2 for purposes of illustration. The larger input wave will produce current pulses as illustrated by the dotted lines indicated G. These pulses again are only slightly larger than the pulses D produced by the input wave of smaller amplitude. It is to be pointed out that the leading edges of pulses G are at the same position as the leading edges of pulses D. Therefore the change in the width of the current pulses produced by the increased amplitude of the applied signal will be only that caused by change of the termination of the current pulses or only one half of the small change in the pulses F at the collector electrode 17 of the transistor. Again, the difference in width of the pulses shown at G in FIG. 2, as compared to the pulses D, is exaggerated for the purpose of illustration.

It is therefore, seen that a very simple circuit has been provided which operates effectively both as a limiter and as a detector for frequency modulated waves. The circuit operates at low signal levels, and provides efficient recovery of the applied signals. The detector circuit described is not critical in operation or adjustment.

What is claimed is:

1. A frequency modulation detector circuit for deriving the modulation signal from a frequency modulated carrier wave having a predetermined center frequency, said circuit including in combination, a transistor having a control electrode and output electrodes, input circuit means connected to said control electrode for applying the modulated wave thereto, and a series circuit including a parallel resonant circuit and rectifier means connecting said resonant circuit to said output electrodes, said series circuit further including impedance means, said parallel resonant circuit being tuned to a frequency above the predetermined center frequency of the modulated wave to be detected, said rectifier means being poled to conduct current in the series circuit of the same polarity which is conducted by said output electrodes to provide current flow through said impedance means, and output circuit means connected to said impedance means for deriving the modulation signal.

2. A frequency modulation detector circuit for deriving the modulation signal from a frequency modulated carrier wave having a predetermined center frequency, said circuit including in combination, a transistor having a control electrode and output electrodes, input circuit means connected to said control electrode for applying the modulated wave thereto, and a series circuit including a parallel resonant circuit and a diode connecting the same to said output electrodes, said series circuit further including impedance means, said parallel resonant circuit being tuned to a frequency above the predetermined center frequency of the modulated wave to be detected and applying a voltage to said diode to hold the same cut off during a part of each cycle of the applied wave, said diode being poled to conduct current in the series circuit of the same polarity which is conducted by said output electrodes to provide current flow through said impedance means, and output circuit means connected to said impedance means for deriving the modulation signal.

3. A frequency modulation detector circuit for deriving the modulation signal from a frequency modulated carrier wave having a predetermined center frequency, said circuit including in combination, a transistor having base, emitter and collector electrodes, input circuit means connected to said base electrode for applying the modulated carrier wave thereto, means connecting said emitter electrode to a reference potential, and a circuit connected to said collector electrode including a diode, a parallel resonant circuit and impedance means connected in series relation in the order named, said parallel resonant circuit being tuned to a frequency above the predetermined center frequency of the modulated wave to be detected, said diode being poled to conduct when the voltage at said collector electrode exceeds the voltage across said tuned circuit to provide current flow through said impedance means, and output circuit means connected to said impedance means for deriving the modulation signal.

4. A frequency modulation detector circuit for deriving the modulation signal from a frequency modulated carrier wave having a predetermined center frequency, said circuit including in combination, a transistor having base, emitter and collector electrodes, input circuit means connected to said base electrode for applying the modulated carrier wave thereto, means connecting said emitter electrode to a reference potential, a parallel resonant circuit, and a series circuit including a diode connecting said resonant circuit to said collector electrode, said series circuit further including impedance means, said diode presenting a high impedance in said series circuit so that said collector electrode is held substantially at said reference potential when said transistor conducts, said parallel resonant circuit being tuned to a frequency above the predetermined center frequency of the modulated wave to be detected, said tuned circuit applying a reverse bias to said diode for holding the same cut off and said collector electrode applying a forward bias to said diode to render the same conductive when such forward bias exceeds the reverse bias to provide current flow through said impedance means, and output circuit means connected to said impedance means for deriving the modulation signal.

5. A frequency modulation detector circuit for deriving the modulation signal from a frequency modulated carrier wave having a predetermined center frequency, said circuit including in combination, a transistor having base, emitter and collector electrodes, input circuit means connected to said base electrode for applying the modulated carrier wave thereto, means connecting said emitter electrode to a reference potential, a parallel resonant circuit, and a series circuit including rectifier means connecting said resonant circuit to said collector electrode, said series circuit further including impedance means, said rectifier means presenting a high impedance in said series circuit so that said collector electrode is held substantially at said reference potential when said transistor conducts, said parallel resonant circuit being tuned to a frequency above the predetermined center frequency of the modulated wave to be detected and producing a voltage greater than the voltage at said collector electrode during a part of each cycle, said tuned circuit applying a reverse bias to said rectifier means to hold the same cut off and said collector electrode applying a forward bias to said rectifier means which exceeds the reverse bias during a part of each cycle to render said rectifier means conductive and thereby provide current flow through said impedance means, and output circuit means connected to said impedance means for deriving the modulation signal.

6. A frequency modulation detector circuit for deriving the modulation signal from a frequency modulated carrier wave having a predetermined center frequency, said circuit including in combination, a transistor having a control electrode and output electrodes, input circuit means connected to said control electrode for applying the modulated wave thereto, and a series circuit including a parallel resonant circuit and a diode connecting the same to said output electrodes, said series circuit further including impedance means, said parallel resonant circuit being tuned to a frequency above the predetermined center frequency of the modulated wave to be detected, said diode being poled to conduct current in the series circuit of the same polarity which is conducted by said output electrodes to provide current flow through said impedance means, said impedance means including capacitor means having the voltage thereacross controlled by current flow in said series circuit, and resistor means connected to said capacitor means for providing a time constant such that the modulation signal is produced across said impedance means, and output circuit means connected to said impedance means for deriving the modulation signal.

No references cited.

KATHLEEN H. CLAFFY, *Primary Examiner.*

R. S. BELL, *Assistant Examiner.*